United States Patent
Chien et al.

(10) Patent No.: US 6,406,968 B1
(45) Date of Patent: Jun. 18, 2002

(54) METHOD OF FORMING DYNAMIC RANDOM ACCESS MEMORY

(75) Inventors: Sun-Chieh Chien; Chien-Li Kuo, both of Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/767,499

(22) Filed: Jan. 23, 2001

(51) Int. Cl.$^7$ ............................................... H01L 21/20
(52) U.S. Cl. ...................................... 438/381; 438/622
(58) Field of Search ................................ 438/197, 238, 438/239, 240, 241, 242, 243, 253, 259, 266, 381, 386, 396, 397, 398, 622, 618, 647, 672, 675, 680

(56) References Cited

U.S. PATENT DOCUMENTS 5,981,369 A * 11/1999 Yoshida et al. ............. 438/597
6,255,151 B1 * 7/2001 Fukuda et al. .............. 438/197
6,281,540 B1 * 8/2001 Aoki ........................... 257/306

* cited by examiner

*Primary Examiner*—David Nelms
*Assistant Examiner*—David Nhu
(74) *Attorney, Agent, or Firm*—Charles C.H. Wu; Wu & Cheung, LLP

(57) ABSTRACT

A method of forming a dynamic random access memory. A substrate having a memory cell region and a logic circuit region is provided. The substrate also has a first dielectric layer thereon. The first dielectric layer in the memory cell region has a bit line and a node contact while the first dielectric layer in the logic circuit region has a first metallic interconnect. An intermediate dielectric layer is formed over the first dielectric layer such that the intermediate dielectric layer in the logic circuit region has a second metallic interconnect that connects electrically with the first metallic interconnect. A capacitor is formed in the intermediate dielectric layer within the memory cell region. A second dielectric layer is formed over the substrate. A third metallic interconnect is formed in the second dielectric layer such that the third metallic interconnect and the second metallic interconnect are electrically connected.

18 Claims, 7 Drawing Sheets

METHOD OF FORMING DYNAMIC RANDOM ACCESS MEMORY

BACKGROUND OF THE INVENTION

1. Field of Invention

The present invention relates to a method of forming a memory device. More particularly, the present invention relates to a method of forming embedded dynamic random access memory (embedded DRAM).

2. Description of Related Art

Embedded dynamic random access memory (embedded DRAM) is a type of DRAM whose memory cell array and logic circuit array are integrated together in a silicon chip. Since accessing speed of embedded DRAM is very high, this type of memory is frequently deployed in high-speed data processing systems such as image processors. Each metal-oxide-semiconductor (MOS) transistor inside the logic circuit serves as a switch. Opening or closing of the switch is controlled by the application of a voltage to the gate terminal of the MOS transistor. For example, a conductive MOS transistor is considered in logic state '1' and a cut-off MOS transistor is considered in logic state '0.' By combining a plurality of these MOS transistors, an ideal logic circuit is formed.

Conventionally, DRAMs can be manufactured in two major routes. In one manufacturing route, MOS devices are formed in the memory cell region and the logic circuit region at the same time. Self-aligned bit line contacts, bit lines and self-aligned node contacts are formed in the memory cell region of the substrate while metallic layers and vias are formed in the logic circuit region dielectric layer. After forming a metallic layer over the vias in the logic circuit region, a dielectric layer is formed over the entire substrate. An opening that exposes the node contact is formed in the dielectric layer inside the memory cell region. The opening is used for fabricating a capacitor. A via opening that exposes a portion of the metallic layer is formed in the logic circuit region. Thereafter, steps necessary for forming a complete embedded DRAM are conducted.

In an alternative manufacturing route, manufacturing steps for forming the memory cell region are conducted first. Word lines and active regions are formed in the substrate and then bit line contacts and bit lines are formed over the substrate. After forming the node contact, a capacitor is formed over the substrate. When all necessary steps for fabricating the memory cell region are complete, gate structures and active regions are formed in the logic circuit region. This is followed by subsequent fabrication of the via and the metallic layer.

Both of the aforementioned routes of manufacturing DRAMs have some drawbacks, including.

1. In the first manufacturing method, both the memory cell region and logic circuit region are completed at the same time. However, the deposited dielectric layer after forming the node contact must have a considerable thickness so that a deeper opening can form in the dielectric layer. This is because deeper openings can produce a capacitor with a larger surface area and hence a greater capacitance. Nevertheless, a thick dielectric layer means that all via openings in the logic circuit region have very high aspect ratios. A high aspect ratio increases the difficulty of etching the dielectric layer to form vias that run all the way down into the metallic layer. This increases the difficulty of forming vias in the logic circuit region.

2. In the second manufacturing method, the memory cell region and the logic circuit region are fabricated separately. However, separate processing often produces a great step height between the memory cell region and the logic circuit region. The presence of a great step height frequently results in alignment problems in the logic circuit region during photolithographic and etching processes. In addition, the step height may affect subsequent device planarization processes as well.

SUMMARY OF THE INVENTION

Accordingly, one object of the present invention is to provide a method of forming the memory cell region and the logic circuit region of a dynamic random access memory (DRAM) such that vias are easier to form in the logic circuit region.

A second object of this invention is to provide a method of forming the memory cell region and logic circuit region of a dynamic random access memory such that a capacitor with a higher capacitance is ultimately produced.

To achieve these and other advantages and in accordance with the purpose of the invention, as embodied and broadly described herein, the invention provides a method of forming a dynamic random access memory. First, a substrate having a memory cell region and a logic circuit region is provided. The memory cell region and the logic circuit region each has a plurality of gate electrodes and a plurality of source/drain regions. A first dielectric layer is formed over the substrate. A liner pad is formed over the first dielectric layer in the memory cell region. A second dielectric layer is formed over the first dielectric layer. A bit line contact is formed in the second dielectric layer inside the memory cell region. The bit line contact and a portion of the liner pad are electrically connected. In the meantime, a contact is formed in the second dielectric layer and the first dielectric layer inside the logic circuit region. A bit line is formed over the second dielectric layer within the memory cell region. A first metallic layer is formed over the second dielectric layer within the logic circuit region. A third dielectric layer is formed over the second dielectric layer. A node contact that electrically connects with a portion of the liner pad is formed in the third dielectric layer and the second dielectric layer inside the memory cell region. At the same time, a first via that connects electrically with the first metallic layer is formed in the third dielectric layer inside the logic circuit region.

An intermediate dielectric layer is formed over the third dielectric layer. The intermediate dielectric layer within the logic circuit region has a plurality of intermediate metallic layers and a plurality of intermediate vias. The intermediate vias and the intermediate metallic layers are electrically connected together for adjusting height level of the intermediate dielectric layer and maintaining electrical connectivity within the logic circuit region. Openings are formed in the intermediate dielectric layer within the memory cell region such that each opening exposes a portion of the node contact. A capacitor is formed inside each opening within the memory cell region. A fourth dielectric layer is formed over the intermediate dielectric layer. A second via is formed in the fourth dielectric layer and the intermediate dielectric layer within the logic circuit region so that the second via and the intermediate metallic layer are electrically connected. A second metallic layer is formed over the fourth dielectric layer and then a fifth dielectric layer is formed over the fourth dielectric layer. A third via is formed in the fifth dielectric layer within the logic circuit region. Finally, a third metallic layer is formed over the fifth dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
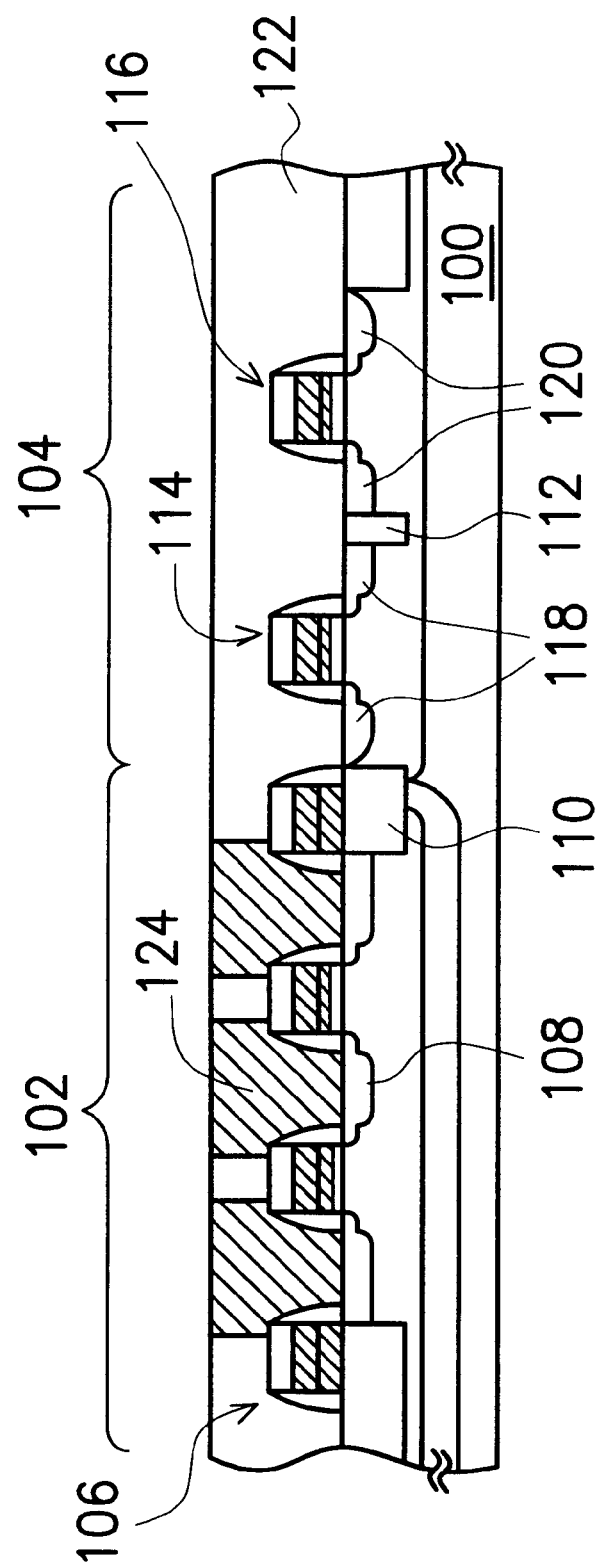
FIGS. 1A through 1G are schematic cross-sectional views showing the progression of steps for forming dynamic random access memory according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the progression of steps for forming dynamic random access memory according to one referred embodiment of this invention.

As shown in FIG. 1A, a memory cell region and a logic circuit region 104 are established on a substrate 100. The memory cell region 102 has a memory cell gate 106 and a memory cell source/drain region 108 in the substrate 100 on each side of the memory cell gate 106. The source/drain regions 108 within the memory cell region 102 are isolated from each other by a shallow trench isolation (STI) region 110. The logic circuit region 104 has a PMOS gate 114, an NMOS gate 116, a source/drain region 118 in the substrate 100 on each side of the PMOS gate 114 and a source/drain region 120 in the substrate 100 on each side of the NMOS gate 116. A dielectric layer 122 is formed over the substrate 100. The dielectric layer 122 can be a silicon oxide layer formed, for example, by chemical vapor deposition. A liner pad 124 is formed in the dielectric layer 122 inside the memory cell region 102. The liner pad 124 is formed, for example, by anisotropic etching to form a self-aligned opening in the dielectric layer 122, and then filling in a conductive material such as polysilicon. The liner pad 124 is designed to increase the contact area so that the depth of subsequent etching necessary for forming bit line contact openings and node contact openings can be reduced.

Figure 1B:
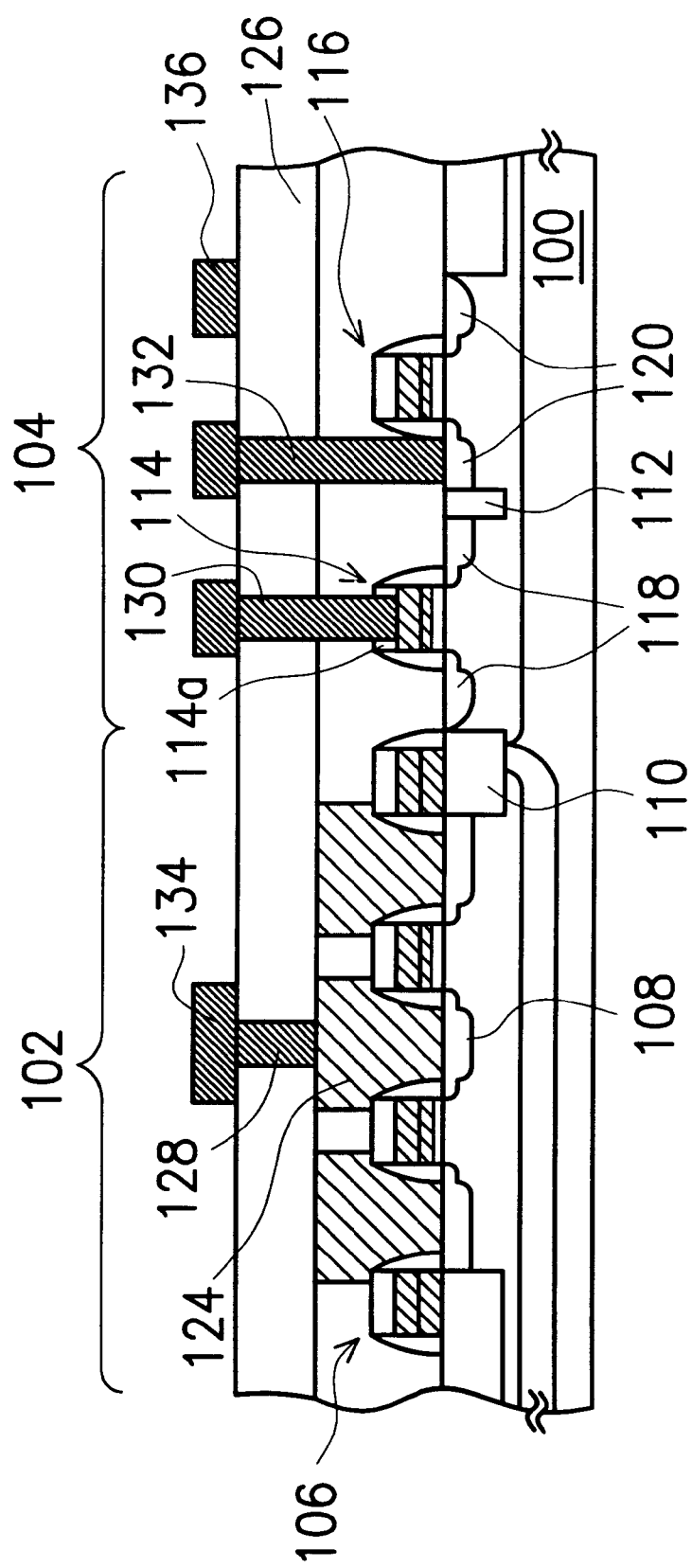

As shown in FIG. 1B, a dielectric layer 126 is formed over the substrate 100. The dielectric layer 126 can be a silicon oxide layer formed, for example, by chemical vapor deposition. A bit line contact 128, a first via 130 and a second via 132 are formed in the dielectric layer 126. A bit line 134 and a metallic layer 136 are formed over the dielectric layer 126. The bit line contact 128, the first via 130, the second via 132, the bit line 134 and the metallic layer 136 are formed, for example, by the following steps. First, a bit line contact opening (not shown) is etched out in the dielectric layer 126 within the memory cell region 102. In the meantime, via openings (not shown) are etched out in the dielectric layers 126 and 122 within the logic circuit region 104. Conductive material is deposited to fill the bit line opening and cover the peripheral gate contact opening, the peripheral contact opening and the substrate 100. The conductive layer is patterned to form the bit line 134 in the memory cell region 102 and the metallic layer 136 in the logic circuit region 104.

Figure 1C:
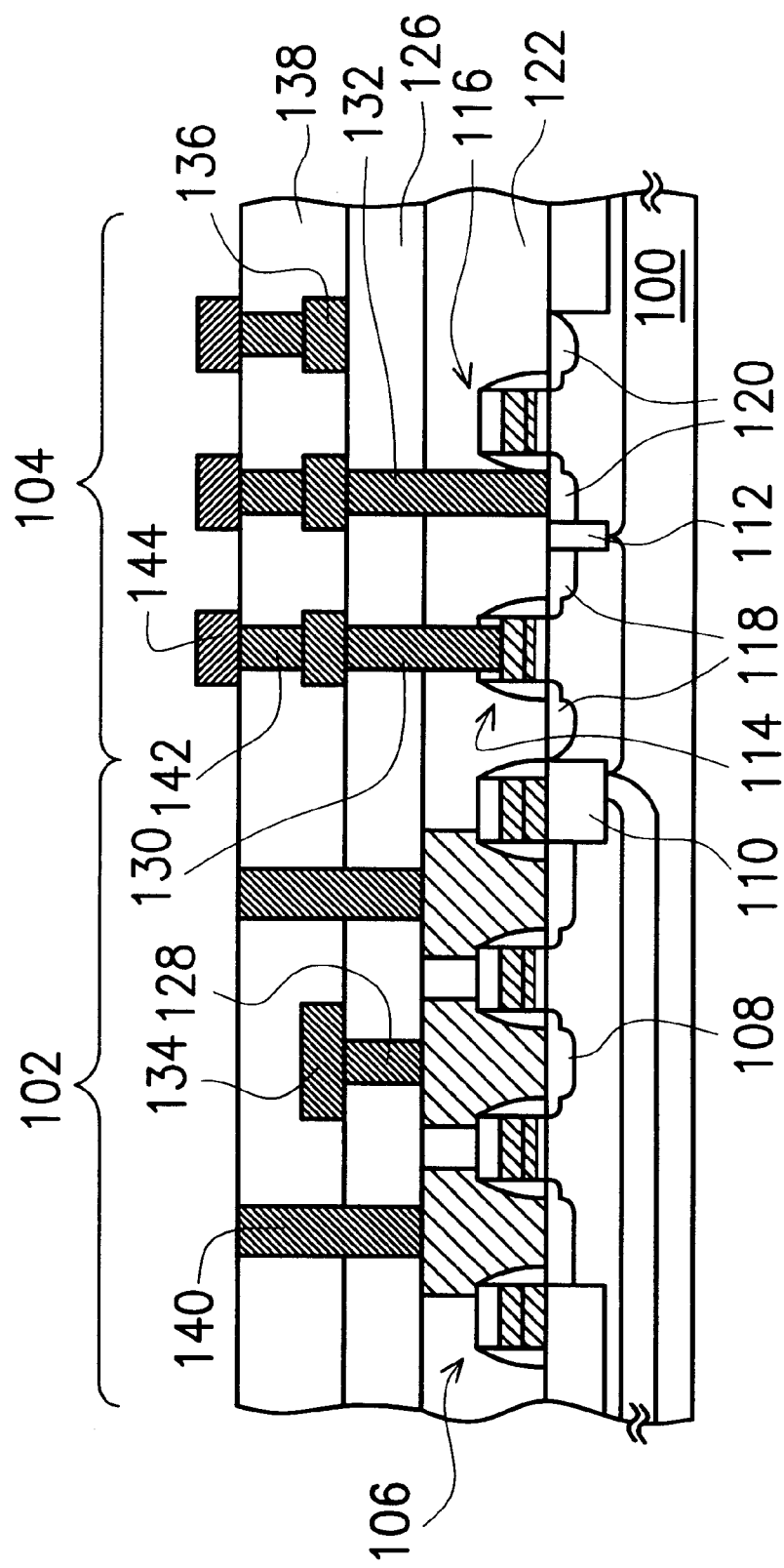

As shown in FIG. 1C, a dielectric layer 138 is formed over the substrate 100. The dielectric layer 138 can be a silicon oxide layer formed, for example, by chemical vapor deposition. A node contact 140 is formed in the dielectric layers 138, 126 inside the memory cell region 102 and a via 142 is formed in the dielectric layer 138 inside the logic circuit region 104. The node contact 140 and the via 142 are formed, for example, by etching the dielectric layers 138, 126 to form a node contact opening (not shown) that exposes a portion of the liner pad 124 and via opening (not shown) that exposes a portion of the metallic layer 136, and then depositing a conductive material into the node contact opening and the via opening. A metallic layer 144 that connects with the via 142 is formed in the logic circuit region 104. The via inside the dielectric layers 122, 126, 138 and the metallic layer 144 together form a first metallic interconnect.

Figure 1D:
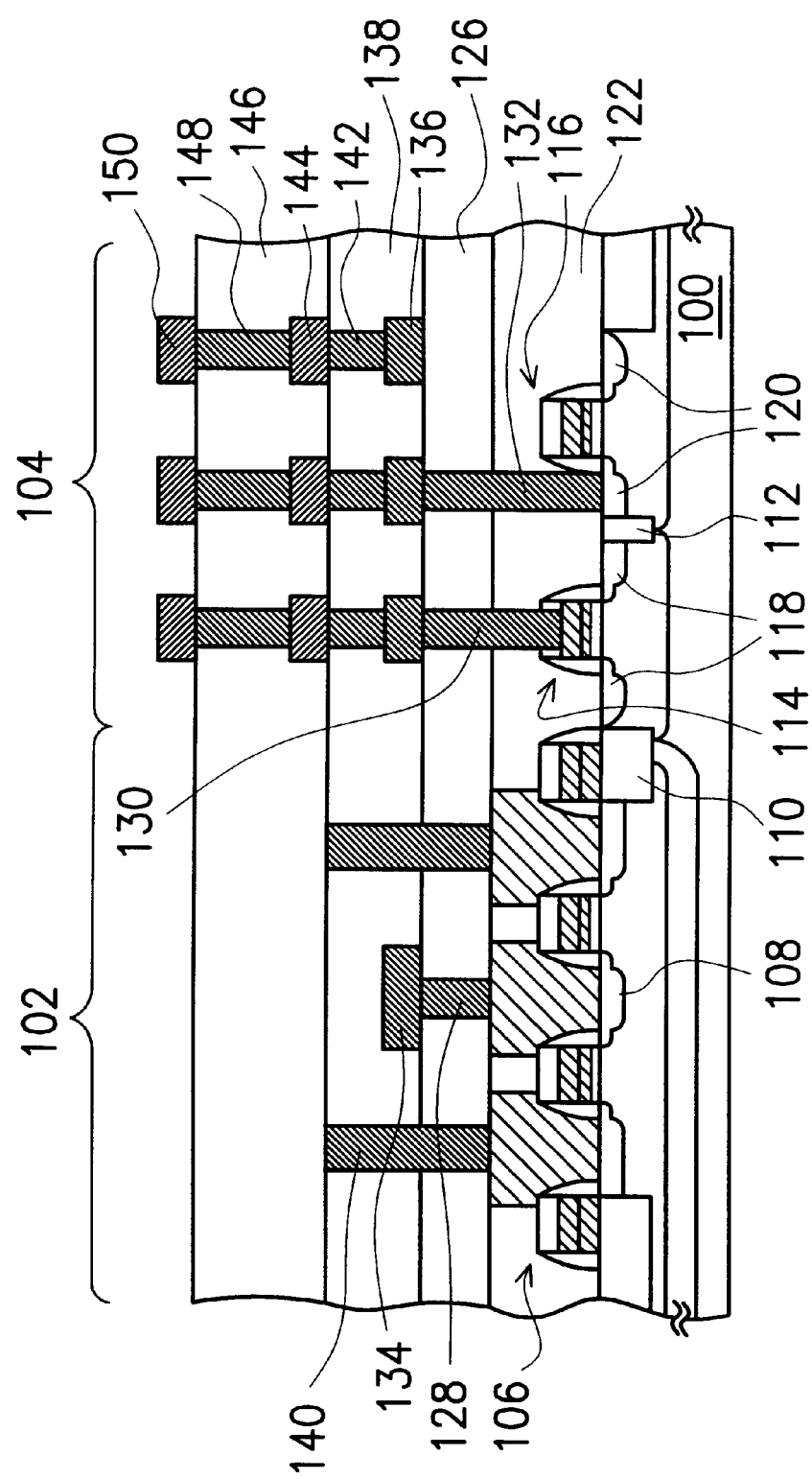

As shown in FIG. 1D, a dielectric layer 146 is formed over the substrate 100. The dielectric layer 146 can be a silicon oxide layer formed, for example, by chemical vapor deposition, A via 148 is formed in the dielectric layer 146 above the metallic layer 144. The via 148 is formed, for example, by etching the dielectric layer 146 to form a via opening (not shown) that exposes a portion of the metallic layer 144, and then depositing conductive material such as tungsten or copper into the via opening. A metallic layer 150 having electrical connection with the via 148 is formed in the logic circuit region 104.

Figure 1E:
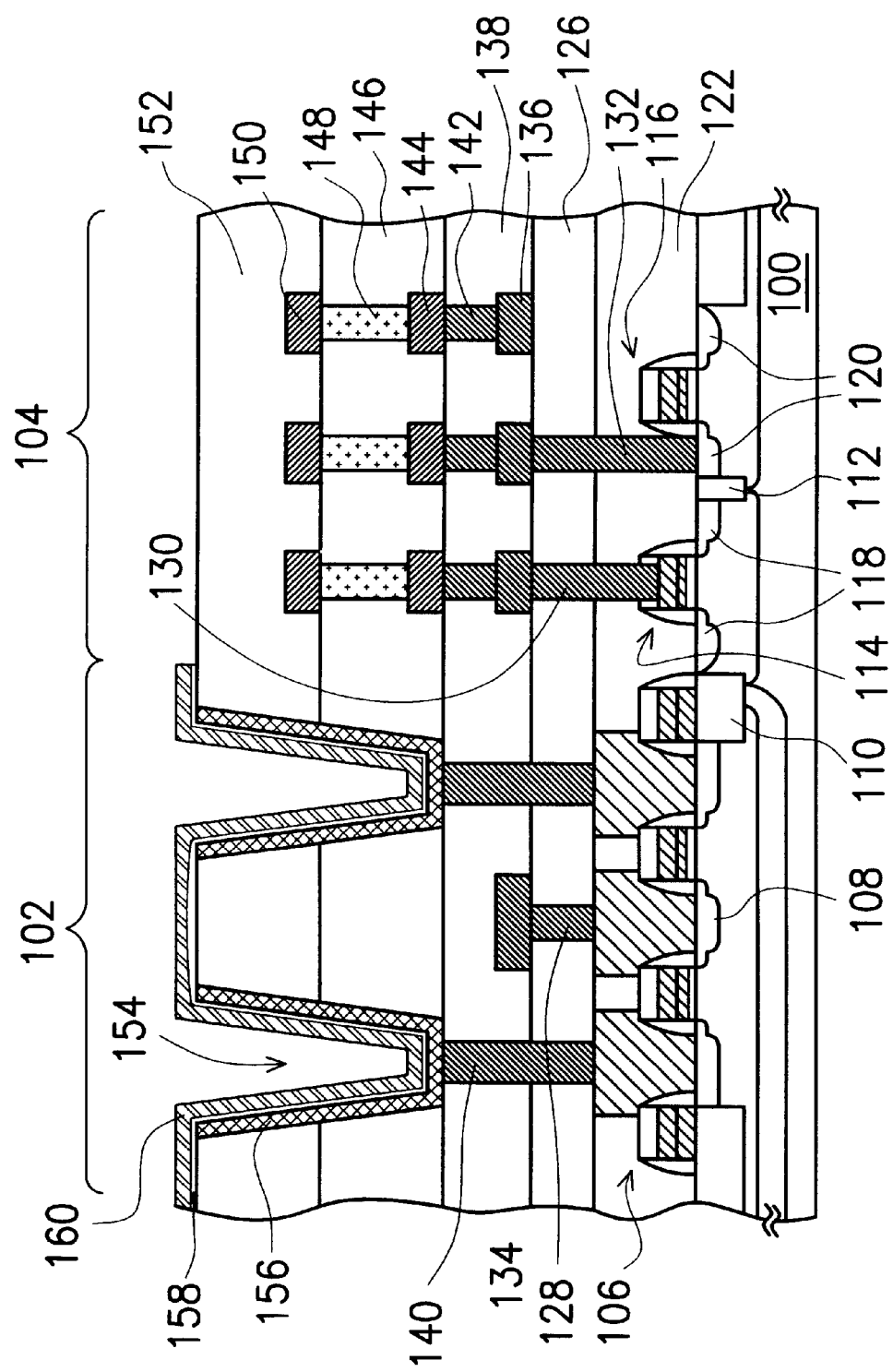

As shown in FIG. 1E, a dielectric layer 152 is formed over the substrate 100. The dielectric layer 152 can be a silicon oxide layer formed, for example, by chemical vapor deposition. A portion of the dielectric layer 152 within the memory cell region 102 is etched to form an opening 154. The opening 154 exposes a portion of the node contact 140. A conductive layer 156 is formed over the exposed opening 154 to serve as a lower electrode. The conductive layer 156 can be a platinum (Pt) layer or a ruthenium layer (Ru) formed, for example, by physical vapor deposition. A conformal dielectric layer 158 is formed over the conductive layer 156 and surface of the memory cell region 102. The dielectric layer 158 can be a tantalum pentoxide ($Ta_2O_5$) layer or a barium titanate ($BaTiO_3$) layer formed, for example, by chemical vapor deposition. Another conductive layer 160 is formed over the dielectric layer 158 serving as an upper electrode, thereby completing the process of forming a capacitor. The conductive layer 160 can be a platinum (Pt) layer or a ruthenium layer (Ru) formed, for example, by physical vapor deposition. Since the capacitor of this invention has an inner cylindrical structure, a lower temperature can be used to form the capacitor. Moreover, the capacitor has a metal-insulator-metal (MM) structure and low interfacial reaction. Hence, the capacitor can have a higher performance.

Figure 1F:
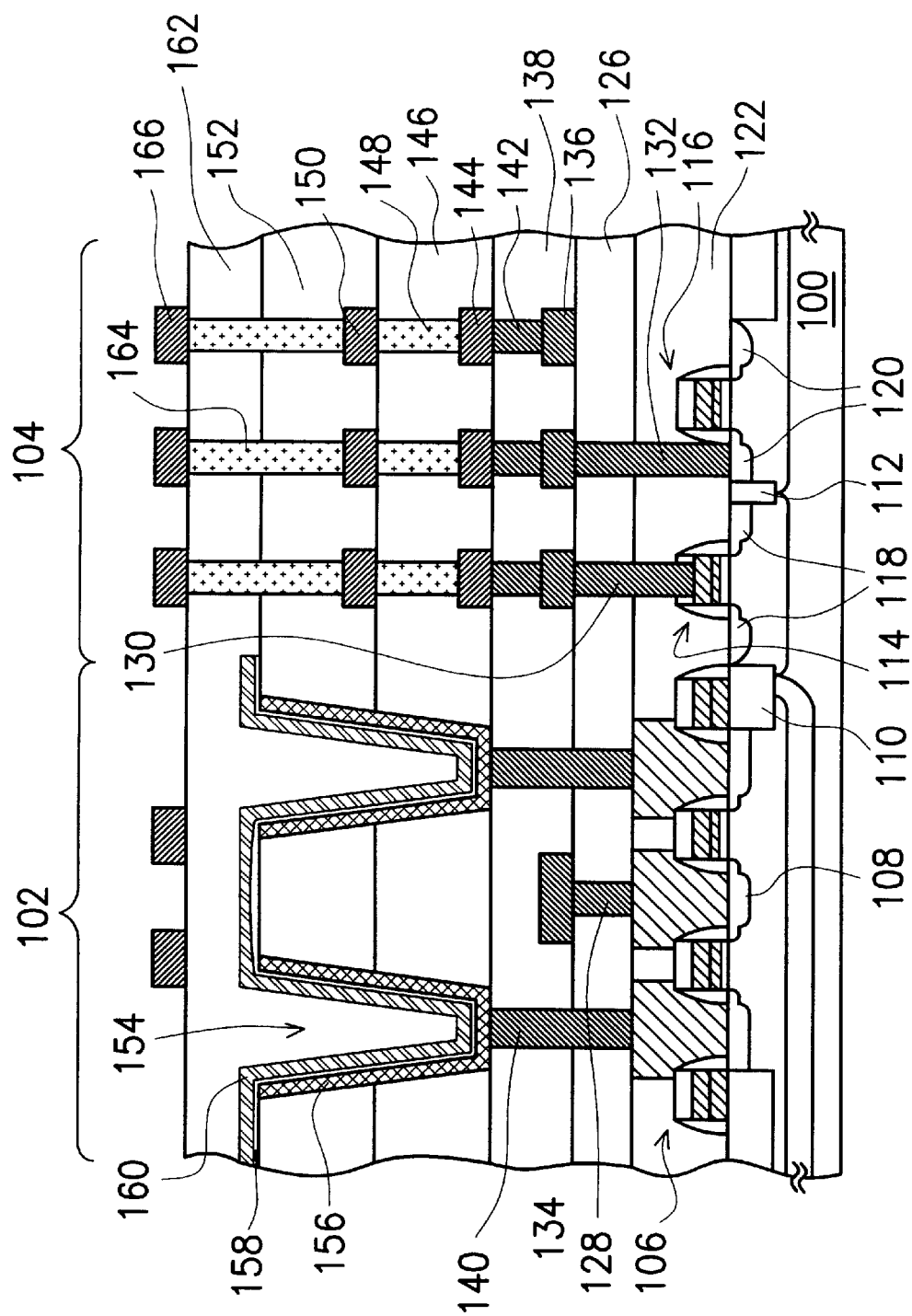

As shown in FIG. 1F, a dielectric layer 162 is formed over the substrate 100. The dielectric layer 162 can be a silicon oxide layer formed, for example, by chemical vapor deposition. A via 164 that connects electrically with the metallic layer 150 is formed in the dielectric layers 162 and 152. The via 164 is formed, for example, by etching the dielectric layers 162 and 152 to form a via opening (not shown) that exposes a portion of the metallic layer 150 and then depositing conductive material such as tungsten or copper into the via opening. A metallic layer 166 that connects electrically with the via 164 is formed over the dielectric layer 162.

In steps carried out as shown in FIG. 1D and 1E, the intermediate dielectric layers for fabricating the capacitor are formed in separate steps. After forming the dielectric layer 146, the via 148 is formed in the dielectric layer 146 and the metallic layer 150 is formed over the dielectric layer 146 so as to maintain electrical contact within the logic circuit region 104. Since depth of the via 164 is reduced, the deposition of a thick dielectric layer is prevented. A thinner dielectric layer can avoid the need to etch out a via opening having a large aspect ratio to reach the conductive layer 144. Not only can more than one intermediate dielectric layer be used in the fabrication of the capacitor, but more than one metallic layer and via can be used inside the intermediate dielectric layers within the logic circuit as well. In fact, the number of layers may be adjusted according to the size (depth) of the capacitor and dielectric constant of capacitor material used. In addition, the via and the metallic layer within the intermediate dielectric layers can be regarded as a second metallic interconnect.

Figure 1G:
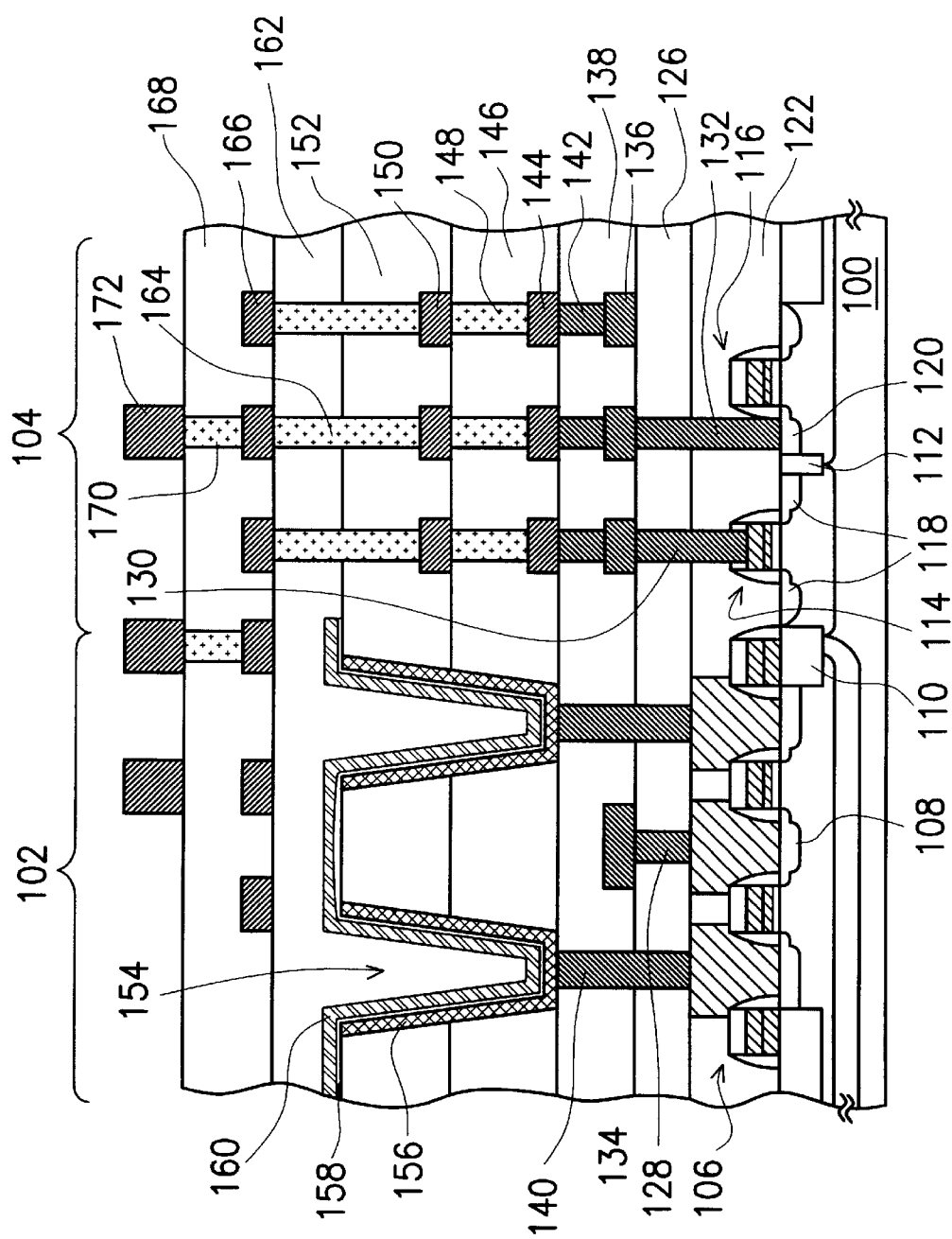

As shown in FIG. 1G, a dielectric layer 168 is formed over the substrate 100. A via 170 is formed in the dielectric layer 168 above a portion of the metallic layer 166. A metallic layer 172 is formed over the dielectric layer 168 to complete the fabrication of an embedded DRAM. The via 170 and the metallic layer 172 in the dielectric layers 162 and 168 can be regarded as a third metallic interconnect.

In summary, one major aspect of this invention is the concurrent fabrication of the memory cell region and the logic circuit region of embedded DRAM. In addition, separate steps are used to form different intermediate dielectric layers instead of forming just one dielectric layer in the fabrication of the capacitor. Meanwhile, vias and metallic layers are also formed in the dielectric layer inside the logic circuit region while the intermediate layers are formed in the memory cell region. Ultimately, the depth of etching necessary for forming a via is greatly reduced. Hence, unlike the high aspect ratio etching necessary for forming vias when the dielectric layer is formed in a single deposition, etching difficulties are removed.

Furthermore, since the metallic interconnect in the logic circuit region can do away with etching via holes with a high aspect ratio, the number of dielectric layers, the number of intermediate metallic layers and the number of intermediate vias can be adjusted according to the size of the capacitor in the memory cell region and the dielectric constant of the material used in the capacitor.

In addition, because the capacitor of this invention has an inner cylindrical structure, a low temperature can be used to form the capacitor. Moreover, the capacitor has a metal-insulator-metal (MIM) structure and low interfacial reaction. Hence, the capacitor can have a higher performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming dynamic random access memory, comprising the steps of:
    providing a substrate having at least a memory cell region and a logic circuit region, wherein the memory cell region and the logic circuit region each has a plurality of gates and a plurality of source/drain regions;
    forming a first dielectric layer over the substrate;
    forming a plurality of connective liner pads in the first dielectric layer within the memory cell region;
    forming a second dielectric layer over the first dielectric layer;
    forming a bit line contact that connects electrically with a portion of the connective liner pad in the second dielectric layer inside the memory cell region and at the same time forming a plurality of contacts in the second dielectric layer and the first dielectric layer within the logic circuit region;
    forming a bit line over the second dielectric layer within the memory cell region and at the same time forming a plurality of first metallic layers over the second dielectric layer within the logic circuit region;
    forming a third dielectric layer over the second dielectric layer;
    forming a plurality of node contacts that connect electrically with a portion of the respective connective liner pads in the third dielectric layer and the second dielectric layer within the memory cell region and at the same time forming a plurality of first vias that connect electrically with the respective first metallic layer in the third dielectric layer within the logic circuit region;
    forming a plurality of intermediate dielectric layers stacked over the third dielectric layer, wherein each of the intermediate dielectric layers in the logic circuit region includes a plurality of intermediate metallic layers and a plurality of intermediate vias therein that are placed in a manner to be electrically connected to one another through the intermediate dielectric layers;
    forming a plurality of openings in the intermediate dielectric layers within the memory cell region such that the openings expose a portion of the respective node contacts;
    forming a capacitor inside the openings of the intermediate dielectric layers within the memory cell region;
    forming a fourth dielectric layer over the intermediate dielectric layers;
    forming a plurality of second vias in the fourth dielectric layer and the intermediate dielectric layers within the logic circuit region for connecting with the respective intermediate metallic layers;
    forming a plurality of second metallic layers over the fourth dielectric layer;
    forming a fifth dielectric layer over the fourth dielectric layer;
    forming a plurality of third vias in the fifth dielectric layer within the logic circuit region; and
    forming a plurality of third metallic layers over the fifth dielectric layer.

2. The method of claim 1, wherein the number of dielectric layers in the intermediate dielectric layer is adjusted according to the size of the capacitor in the memory cell.

3. The method of claim 1, wherein each of the dielectric layers further includes an intermediate metallic layer and an intermediate via.

4. The method of claim 1, wherein material constituting the intermediate vias includes tungsten or copper.

5. The method of claim 1, wherein the step of forming the capacitor further includes the sub-steps of:
    forming a first conductive layer over the exposed openings to serve as a lower electrode;
    conformally forming a sixth dielectric layer over the first conductive layer; and
    forming a second conductive layer over the dielectric layer to serve as an upper electrode.

6. The method of claim 5, wherein material constituting the first conductive layer and the second conductive layer includes platinum.

7. The method of claim 5, wherein material constituting the first conductive layer and the second conductive layer includes ruthenium.

8. The method of claim 5, material constituting the sixth dielectric layer includes tantalum pentoxide.

9. The method of claim 5, wherein material constituting the sixth dielectric layer includes barium titanate.

10. A method of forming dynamic random access memory, comprising the steps of:

provoiding a substrate having a memory cell region and a logic circuit region and covered by a first dielectric layer, wherein the first dielectric layer within the memory cell region has a bit line and a plurality of node contacts while the first dielectric layer within the logic circuit region has a first metallic interconnect;

forming a plurality of intermediate dielectric layers stacked over the first dielectric layer, wherein the intermediate dielectric layers within the logic circuit region include a second metallic interconnect electrically connected with the first metallic interconnect;

forming a capacitor that extends through the intermediate dielectric layers within the memory cell region;

forming a second dielectric layer over the substrate; and forming a third metallic interconnect in the second dielectric layer; wherein a portion of the third metallic interconnect and the second metallic interconnect are electrically connected.

11. The method of claim 10, wherein the number of dielectric layers in the intermediate dielectric layer is adjusted according to the size of capacitor in the memory cell region.

12. The method of claim 10, wherein the first, the second and the third metallic interconnects are constructed out of a plurality of intermediate metallic layers and a plurality of intermediate vias.

13. The method of claim 10, wherein material constituting the intermediate vias includes tungsten or copper.

14. The method of claim 10, wherein the step of forming the capacitor includes the sub-steps of:

forming a plurality of openings in the intermediate dielectric layers inside the memory cell region, wherein the openings expose a portion of the respective node contacts;

forming a first conductive layer through each opening to serve as a lower electrode;

conformally forming a third dielectric layer over the first conductive layer; and forming a second conductive layer over the third dielectric layer to serve as an upper electrode.

15. The method of claim 14, wherein material constituting the first conductive layer and the second conductive layer includes platinum.

16. The method of claim 14, wherein material constituting the first conductive layer and the second conductive layer includes ruthenium.

17. The method of claim 14, wherein material constituting the dielectric layer includes tantalum pentoxide.

18. The method of claim 14, wherein material constituting the dielectric layer includes barium titanate.

* * * * *